United States Patent [19]
Rozman et al.

[11] Patent Number: 6,005,773
[45] Date of Patent: Dec. 21, 1999

[54] BOARD-MOUNTABLE POWER SUPPLY MODULE

[75] Inventors: Allen Frank Rozman, Richardson; David Leonard Stevens, Mesquite, both of Tex.

[73] Assignee: Lucent Technologies Inc., Murray Hill, N.J.

[21] Appl. No.: 08/879,478

[22] Filed: Jun. 20, 1997

Related U.S. Application Data

[63] Continuation-in-part of application No. 08/772,681, Dec. 23, 1996, Pat. No. 5,835,350.

[51] Int. Cl.⁶ ..................................................... H05K 7/20
[52] U.S. Cl. .......................... 361/707; 361/719; 363/141
[58] Field of Search .............................. 307/64, 117, 150; 165/80.3, 185; 363/141, 144; 361/704, 705, 707, 709, 710, 713, 715–720, 736, 750

[56] References Cited

U.S. PATENT DOCUMENTS

| | | |
|---|---|---|
| 4,965,710 | 10/1990 | Pely . |
| 5,075,821 | 12/1991 | McDonnal . |
| 5,303,138 | 4/1994 | Rozman ..................................... 363/21 |
| 5,365,403 | 11/1994 | Vinciarelli et al. ...................... 361/707 |
| 5,497,289 | 3/1996 | Sugishima . |
| 5,570,270 | 10/1996 | Naedel . |
| 5,590,032 | 12/1996 | Bowman et al. .......................... 363/15 |
| 5,625,541 | 4/1997 | Rozman ..................................... 363/21 |
| 5,694,297 | 12/1997 | Smith . |
| 5,835,350 | 11/1998 | Stevens . |

OTHER PUBLICATIONS

Data Sheet, Vicor Corporation, Nov. 1996, "48V in /12V out/ 150W DC–DC Converter Module", pp. 1–12.

"A New Leadframeless IC Carrier Package Using Metal Base Substrate", ISHM '95 Proceedings, Tanaka, Nagamine, Koike, Takahashi, pp. 348–353.

Date Sheet, AT&T Microelectronics, Jun. 1993, "FW050A, FW100A, FW150A Power Modules: dc–dc Converters; 48 Vdc Input, 5 Vdc Output, 50 W to 150 W", pp. 1–12.

Advance Data Sheet, Lucent Technologies, Dec. 1996, "FW300–Series Power Modules: 36 Vdc to 75 Vdc Input; 300 W", pp. 1–12.

Data Sheet, AT&T Microelectronics, Apr. 1996, "JW050A, JW075A; JW100A, JW150A Power Modules: dc–dc Converters; 36 Vdc to 75 Vdc Input; 50 W to 150 W", pp. 1–16.

Advance Data Sheet, Lucent Technologies, Mar. 1997, "HW075x1–E, HW100x1 Power Modules: 36 Vdc to 75 Vdc Input, 2 Vdc to 5 Vdc Single Output; 75 W, 100 W", pp. 1–12.

*Primary Examiner*—Gerald Tolin
*Attorney, Agent, or Firm*—Robert R. Axenfeld; Lester H. Birnbaum; Craig J. Cox

[57] ABSTRACT

A power supply module package suitable for both high packaged power density and cost effective manufacture. In an exemplary embodiment, the power supply module includes: (1) at least one printed circuit board containing conductors for interconnecting components of the power supply, (2) a thermally conductive baseplate or case operable for transferring heat generated inside the module to the outside environment, wherein the external package dimensions are of a sufficiently small size to allow the user the greatest flexibility in the design of the overall circuit assembly, (3) at least one power magnetic device operable for providing electrical isolation between the input and the output of the power module, and (4) a set of electrical leads to facilitate communication and power flow between the module and circuitry being powered. The present invention provides a highly compact, thermally conductive package for a power supply module (perhaps a DC/DC converter) that is cost effective, readily manufacturable, durable, and easily mounted to a circuit card, allowing the power module to, for example, form a portion of a distributed power architecture.

28 Claims, 15 Drawing Sheets

BOARD-MOUNTABLE POWER SUPPLY MODULE

REFERENCE TO CROSS-RELATED APPLICATIONS

This application is a continuation-in-part of U.S. application Ser. No. 08/722,681 filed Dec. 23, 1996 issued as U.S. Pat. No. 5,835,350 on Nov. 10, 1998.

FIELD OF THE INVENTION

The present invention is directed to power electronics in general and, more specifically, to a high density board mounted power supply module for powering electronic circuitry.

BACKGROUND OF THE INVENTION

The trend in the design of power systems for electronic assemblies has been toward the use distributed power architectures. In a distributed power system, many small, individual board mounted power supply modules are used in place of a few larger, centralized power supplies. Such a distributed power architecture could be used to power a diverse variety of electronic assemblies, including, for example, a computer work station, a file server, or a telecommunications switching system. Each of the board mounted power modules is conveniently located close to the circuitry being powered, often with one or more power modules located on each circuit card in the electronic assembly. It is advantageous to minimize the size of the individual power modules, as the circuit card space used by the power module could be used, for example, for additional circuitry to increase the processing throughput of a computer card, or to increase the switching capacity of a telecommunications card. Therefore, a power module which has a relatively large footprint area is generally considered undesirable. Additionally, many electronic assemblies employ circuit card to circuit card spacing of less than one inch. Minimizing the card to card spacing allows for a denser assembly, which advantageously increases throughput or capacity. It is therefore desirable to provide a power module with the additional attribute of a low height profile.

Consequently, the trend in the design of power supply modules has been toward achieving increased output power along with a lower height profile and a smaller footprint area, thereby increasing power density. However, any improvements in power level, power density or profile cannot be at the expense of the thermal and electrical characteristics of the overall power module and its constituent internal devices.

A power supply module is conventionally constructed as a unitary, encapsulated package, with one or more rows of leads to connect the module to a circuit card, and a metallic case containing attachment mounts for an external heatsink. The internal construction of the power module often comprises one or more power devices (e.g., transistors and diodes) in thermal communication with the metal case, one or more magnetic devices (e.g., transformers and inductors) providing electrical isolation and energy storage, and one or more circuit boards containing electronic components to, among other things, provide control and monitoring functions.

Using a DC/DC power converter as an example, a simplified internal structure of a conventional power module package will hereinafter be described. The packaged power devices and magnetic devices that must be thermally managed due to high power dissipation are mounted onto a metal circuit board employing an insulated metal substrate technology, such as a THERMAL CLAD substrate manufactured by the Bergquist Corporation of Minneapolis, Minn. The metal circuit board also contains components for filtering and control. The remainder of the filtering and control components are mounted to a conventional FR4 printed circuit board, which is mechanically and electrically connected to the metal circuit board to facilitate communication and power flow between various parts of the power supply module. Leads allowing for communication and power flow between the power module and the external circuit card are mechanically and electrically fastened to one or both of the circuit boards in the power module. The power module is cased in a plastic or metallic enclosure which receives an encapsulant operable for protecting the internal components from contaminants and perhaps to improve heat flow between the internal components and the enclosure. The enclosure also contains means for attaching an external heatsink.

While the aforementioned internal structure provides a viable alternative for packaging a power supply module, it endures several limitations. First, it requires two printed wire boards to accommodate components and interconnection traces, e.g., the metal circuit board and the FR4 circuit board. Such a two board design increases the cost of the module and increases complexity of assembly. Second, the module employed discrete magnetic devices and did not incorporate planar magnetics into the printed circuit board. The use of planar magnetics can reduce the size of the design by allowing components to be placed directly on top of transformer and inductor windings, thus effectively making double use of the available internal space. Planar magnetics can also reduce the cost of the module. Third, the packaged power density is low. Finally, the design requires several iterative manual steps that are not consistent with a mass producible and cost effective design for a power supply module.

Accordingly, what is needed in the art is a power supply module which simultaneously achieves the requirements of high packaged power density and cost effectiveness, without sacrificing the thermal and electrical characteristics of the device. Preferably, the aforementioned power supply module should present a user with the minimum number of features and functions required to provide tight tolerance remote voltage regulation, protection during a fault or trouble condition, and external control of the power supply module.

SUMMARY OF THE INVENTION

To address the above described deficiencies in the prior art, the present invention provides a power supply module package suitable for both high packaged power density and cost effective manufacture. The power supply module includes: (1) at least one printed circuit board containing conductors for interconnecting components of the power supply, (2) a thermally conductive baseplate or case operable for transferring heat generated inside the module to the outside environment, wherein the external package dimensions are of a sufficiently small size to allow the user the greatest flexibility in the design of the overall circuit assembly, (3) at least one power magnetic device operable for providing electrical isolation between the input and the output of the power module, and (4) a set of electrical leads to facilitate communication and power flow between the module and circuitry being powered.

The present invention therefore introduces a highly compact, thermally conductive package for a power supply module (perhaps a DC/DC converter) that is cost effective, readily manufacturable, durable, and easily mounted to a circuit card, allowing the power module to, for example, form a portion of a distributed power architecture.

In one exemplary embodiment of the present invention, the circuit board includes a planar magnetic device integrated into the board, wherein conductors of the circuit board form the windings of the planar magnetic device, and a core of the planar magnetic device is disposed through apertures of the circuit board proximate the windings.

In another exemplary embodiment of the present invention, components of the power module (e.g., control or filtering circuitry) are located on the circuit board directly above or below the planar magnetic windings, such that the components are partially exposed to the magnetic and electric fields generated by the windings. The present invention may take advantage of this component placement to enhance the compactness of the power module.

In another embodiment of the present invention, the thermally conductive baseplate or case further includes an integral electrically insulating layer. The thermally conductive baseplate or case may further include an integral electrically conductive circuit layer on the integral electrically insulating layer; portions of the circuit layer are thus capable of being removed to form electrically conductive traces therein In still another exemplary embodiment of the present invention, power semiconductor devices or other electrical components may be advantageously located within the thermally conductive baseplate or case to enhance the transfer of heat from the power semiconductor devices or other electrical components to the outside environment. The devices may be attached to the baseplate or case using a solder connection, a mechanical attachment means, or a glue or epoxy bond, for example.

In a further embodiment of the present invention, the set of electrical leads comprise posts extending from the circuit board, operable for connecting the power supply module to an external circuit card using through hole soldering techniques, or sockets. The set of electrical leads could also comprise surface mountable leads operable for connecting to an external circuit card using surface mount soldering techniques.

In still a further embodiment of the present invention, the set of electrical leads comprises at least the following functions:

(i) a positive input voltage lead, Vin(+), and a negative input voltage lead, Vin(−), for connecting the module to an input power source, (ii) an Enable lead allowing the user to remotely turn the module on or off, (iii) a positive output voltage lead, Vout(+), and a negative output voltage lead, Vout (−), for connecting the module output to the circuitry being powered, (iv) a positive sense lead, Sense(+), and a negative sense lead, Sense(−), providing the module with a remote sensing capability, and (v) a Trim lead allowing the user to externally program the voltage level of the module output. This is not necessary to the broad scope of the invention, however.

In another embodiment of the present invention, the case forms a reservoir and an encapsulant substantially fills the reservoir. Of course, the encapsulant may merely fill a portion of the reservoir In still a further embodiment of the present invention, the power supply module is constructed as an open frame structure, allowing air to pass directly through the module to facilitate the transfer of heat from the internal components to the external environment In further embodiments of the present invention, the case contains means to rigidly attach an external heatsink to facilitate the transfer of heat from the module to the external environment. The heatsink could also be constructed as an integral part of the case, including, for example, a die cast case wherein a pin-fin heatsink arrangement is cast as an integral part of the case.

The foregoing has outlined, rather broadly, preferred and alternative features of the present invention so that those skilled in the art may better understand the detailed description that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention.

Other embodiments, features and advantages of the present invention will become apparent after reading the foregoing description.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

The present invention is directed to a high density board mounted power supply module for powering electronic circuitry such as illustrated with reference to FIGS. 7–14.

Figure 1:
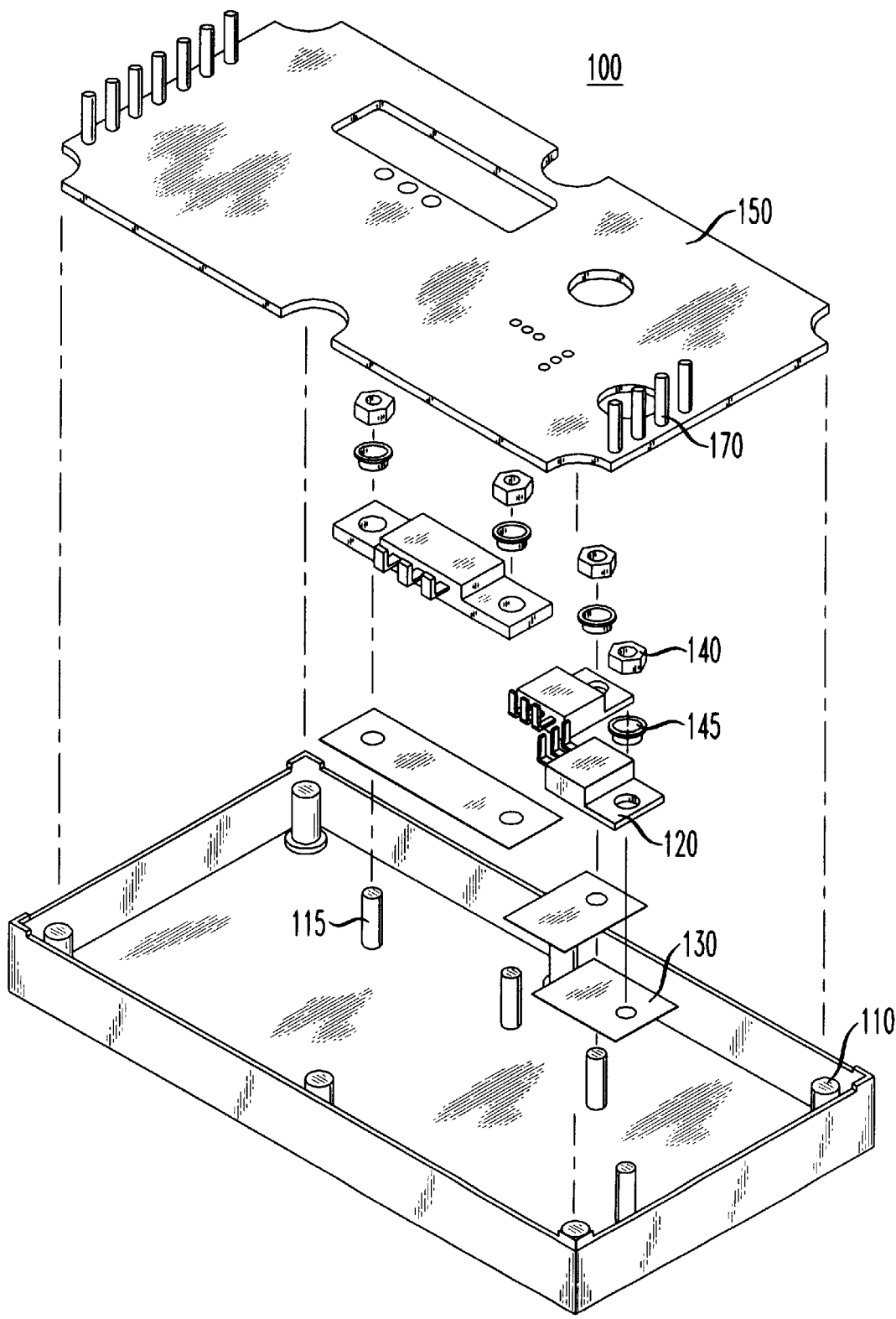
FIG. 1 illustrates an exploded isometric view of a prior art power supply.

Referring initially to FIG. 1, illustrated is an exploded isometric view of a prior art power supply 100. The power supply 100 includes a metal case 110 having a plurality of fasteners (one of which is designated 115). The power supply 100 also includes a plurality of semiconductor power devices (one of which is designated 120) coupled to the metal case 110 (via the fasteners 115) through a plurality of insulators (one of which is designated 130) by a plurality of nuts and washers (one pair of which is designated as 140, 145). The metal case 110 in this example does not contain printed circuit board traces, and therefore does not directly interconnect the power semiconductor devices. The power supply 100 further includes a circuit board 150 having a plurality of magnetic and other electrical components (not shown). The power supply 100 still further includes a plurality of leads (one of which is designated 170) for connection to a printed circuit board of a electrical piece of equipment employing the power supply 100 to advantage.

Figure 2:
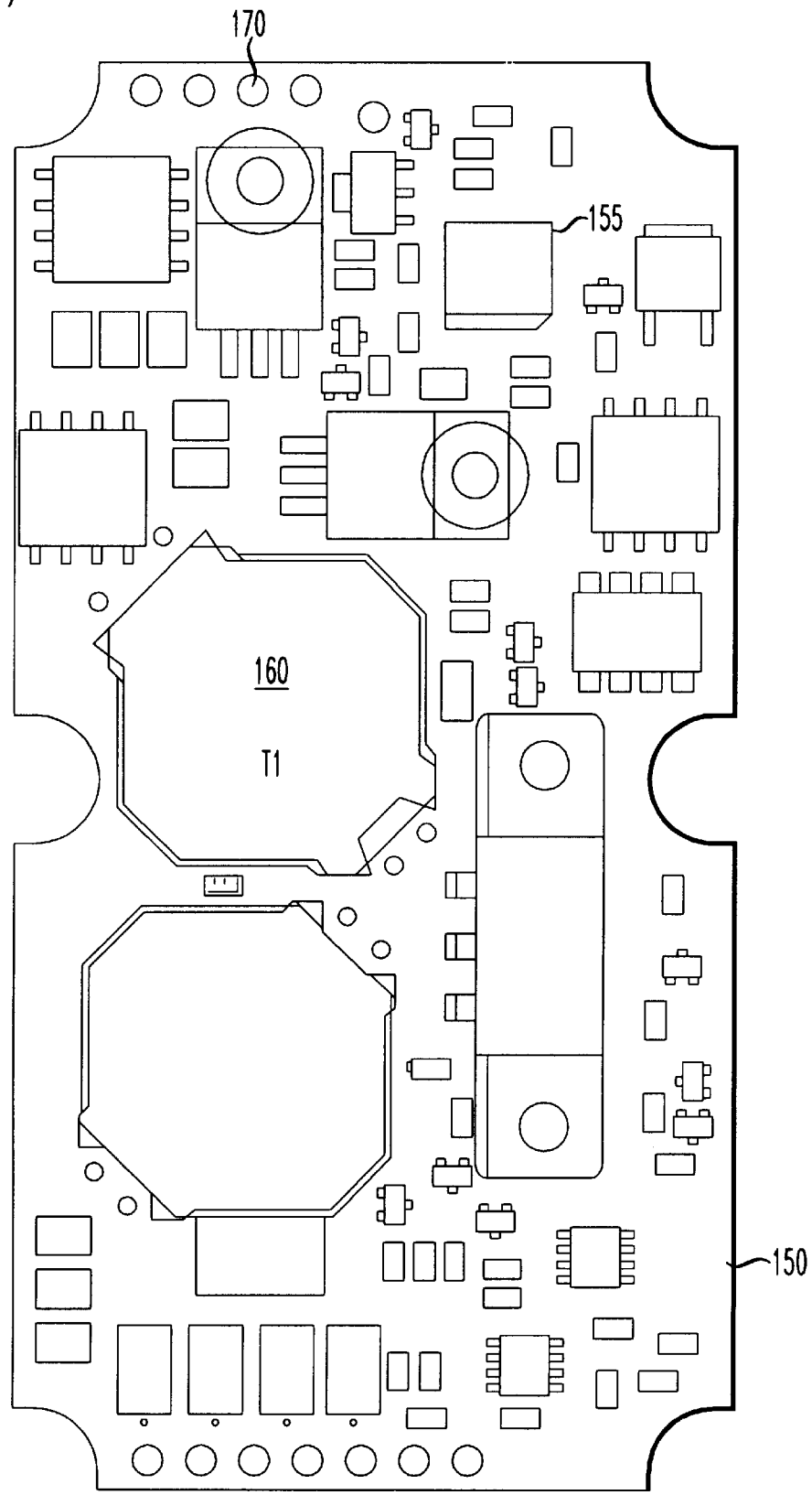
FIG. 2 illustrates a detailed view of a possible component placement for a circuit board of a prior art power supply.

Referring now to FIG. 2, illustrated is a detailed view of a possible component placement for circuit board 150 (from FIG. 1). The circuit board 150 includes a plurality of discrete magnetic components (one of which is designated 160) suitable for processing electrical power, and a plurality of electrical components operable, for example, for control and monitoring functions (one of which is designated 155). Magnetic device 160 may be a planar magnetic device, but in this example the device 160 is conventionally constructed using discrete windings and a bobbin assembly, and the entire device 160 is disposed through an aperture T1 in circuit board 150.

Referring to FIGS. 1 and 2, for the reasons previously mentioned, the power supply 100 endures several limitations. First, the package density of the power supply 100 is low. Thus, in a period where the trend is toward higher power density power supply modules, the foregoing design for packaging the power supply 100 is contrary to the present trend and provides a lower power density package. Second, the design makes use of discrete power magnetic devices and does not integrate planar magnetic devices into the board 150. This type of design does not allow components to be located directly above or below the magnetic device windings on the board 150. As stated previously, locating electrical components directly above or below the magnetic device windings advantageously allows for a more compact power module package. Third, the design requires several iterative manual steps that do not support a cost effective and mass producible design for power supplies. For example, the magnetic devices are produced separately, and are not produced as an integral part or the circuit board. Finally, the power semiconductor devices 120 consume only a small portion of the overall surface area in case 110, leading to a lower density power module package.

Figure 3:
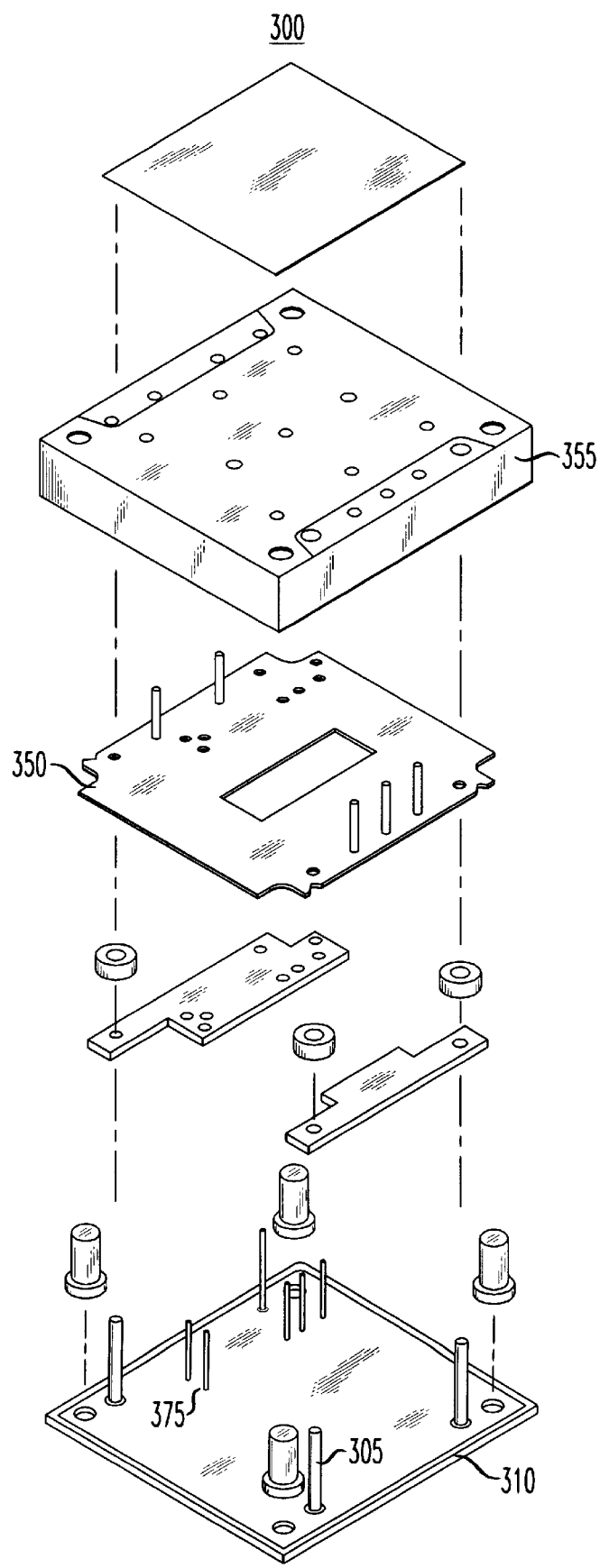
FIG. 3 illustrates an exploded isometric view of a prior art power supply.

Referring now to FIG. 3, illustrated is an exploded isometric view of a prior art power supply 300. The power supply 300 includes a metal baseplate 310 containing a plurality of electrical leads (one of which is designated 305) protruding upward from baseplate 310 for connection to a printed wiring board of an electrical piece of equipment employing the power supply 300 to advantage. The metal baseplate 310 in this example may be constructed using an insulated metal substrate such as THERMAL CLAD, which contains printed circuit board traces useful for interconnecting the power semiconductor devices and other electrical components (printed circuit board traces not shown). The power supply 300 further includes a circuit board 350 having a plurality of electrical components (not shown). The metal baseplate 310 contains a plurality of interconnection pins (one of which is designated 375) for connecting the metal baseplate to the circuit board 350. A plastic (or metal) case 355 serves to protect the components of power supply 300, and also forms a reservoir capable of containing an encapsulant.

Figure 4:
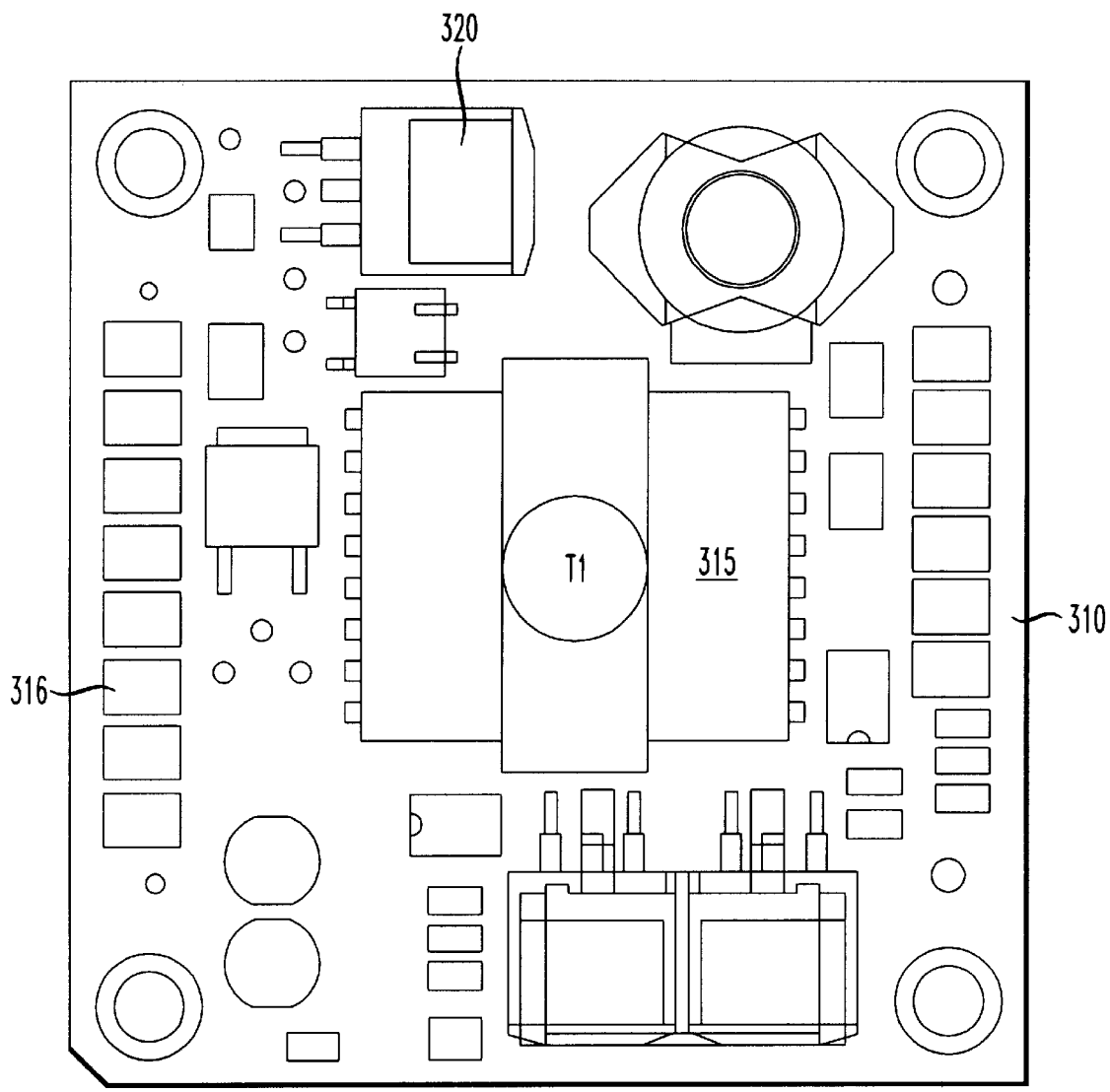
FIG. 4 illustrates a detailed view of a possible component placement for a circuit board of a prior art power supply.

FIG. 4 illustrates an exemplary detailed component placement for baseplate 310, including a plurality of power magnetic devices (one of which is designated 315) and other electrical components (one of which is designated 316). The power magnetic devices 315 in this example are discrete devices and are not integrated into baseplate 310. The baseplate 310 also includes a plurality of semiconductor power devices (one of which is designated 320) coupled to the metal baseplate 310 using conventional surface mount soldering techniques.

Figure 5:
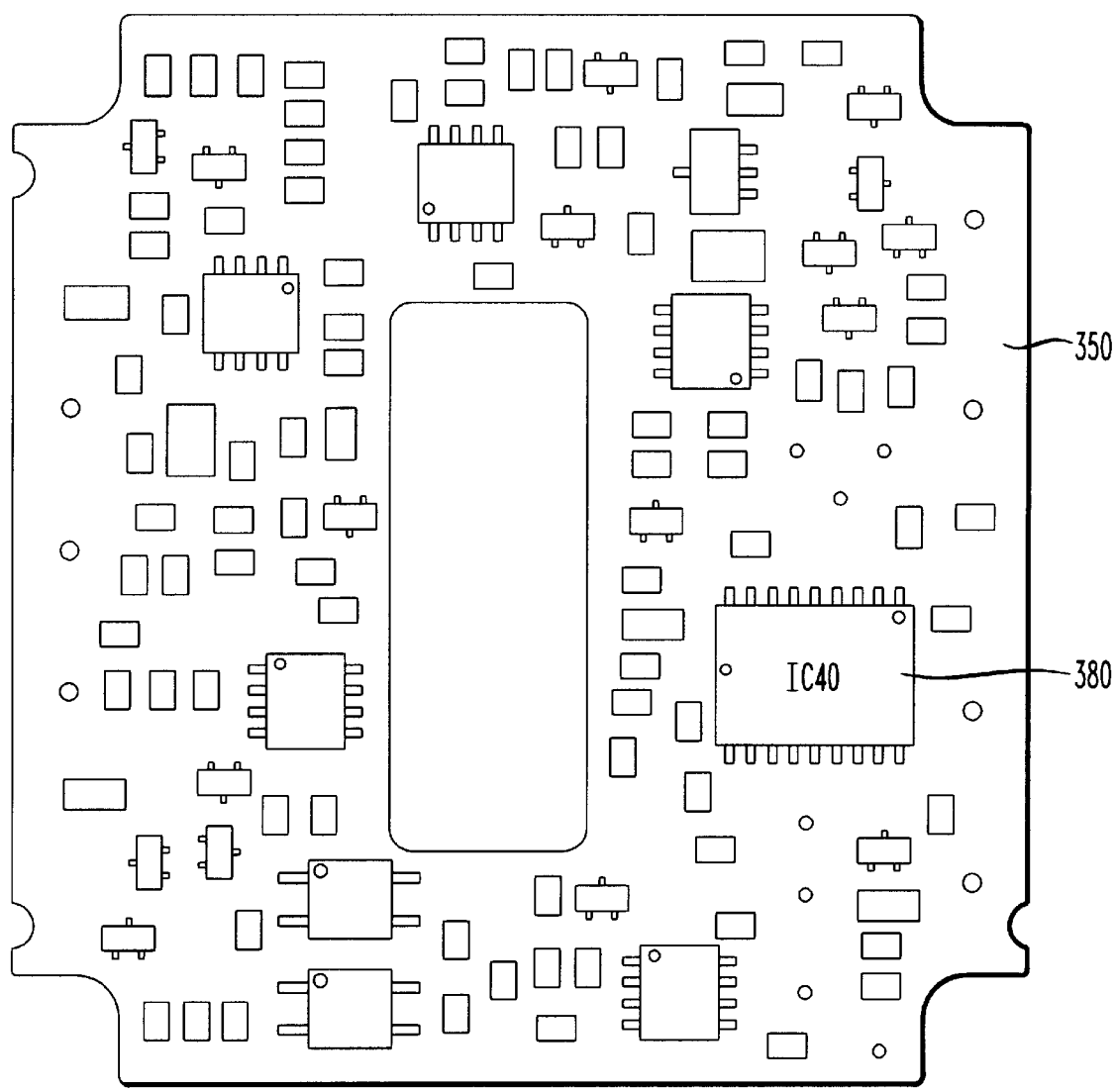
FIG. 5 illustrates a detailed view of a possible component placement for a circuit board of a prior art power supply.

In FIG. 5 is shown a possible component placement for one side of circuit board 350, including a plurality of electrical components, one of which is designated 380. Note that circuit board 350 does not contain any planar magnetic devices integrated into the circuit board 350.

For the reasons as previously mentioned, the power supply 300 (FIG. 3) endures several limitations. First, while the package density of power supply 300 is greater than that of power supply 100, it is still lower than is generally desirable. Second, the design makes use of discrete power magnetic devices 315 (FIG. 4) and does not integrate planar magnetic devices into the board 350 of FIG. 5. This type of design does not allow components to be located directly above or below the magnetic device windings on the board 350, with the consequent reduction in achievable packaged power density. Third, the design requires several iterative manual steps that do not support a cost effective and mass producible design for power supplies. For example, the magnetic devices are produced separately, and are not produced as an integral part or the circuit board. Finally, the design requires two printed circuit boards 310 of FIG. 4 and 350 of FIG. 5 to process the power and control functions, hence the design may be more costly to produce than is desirable.

Figure 6:
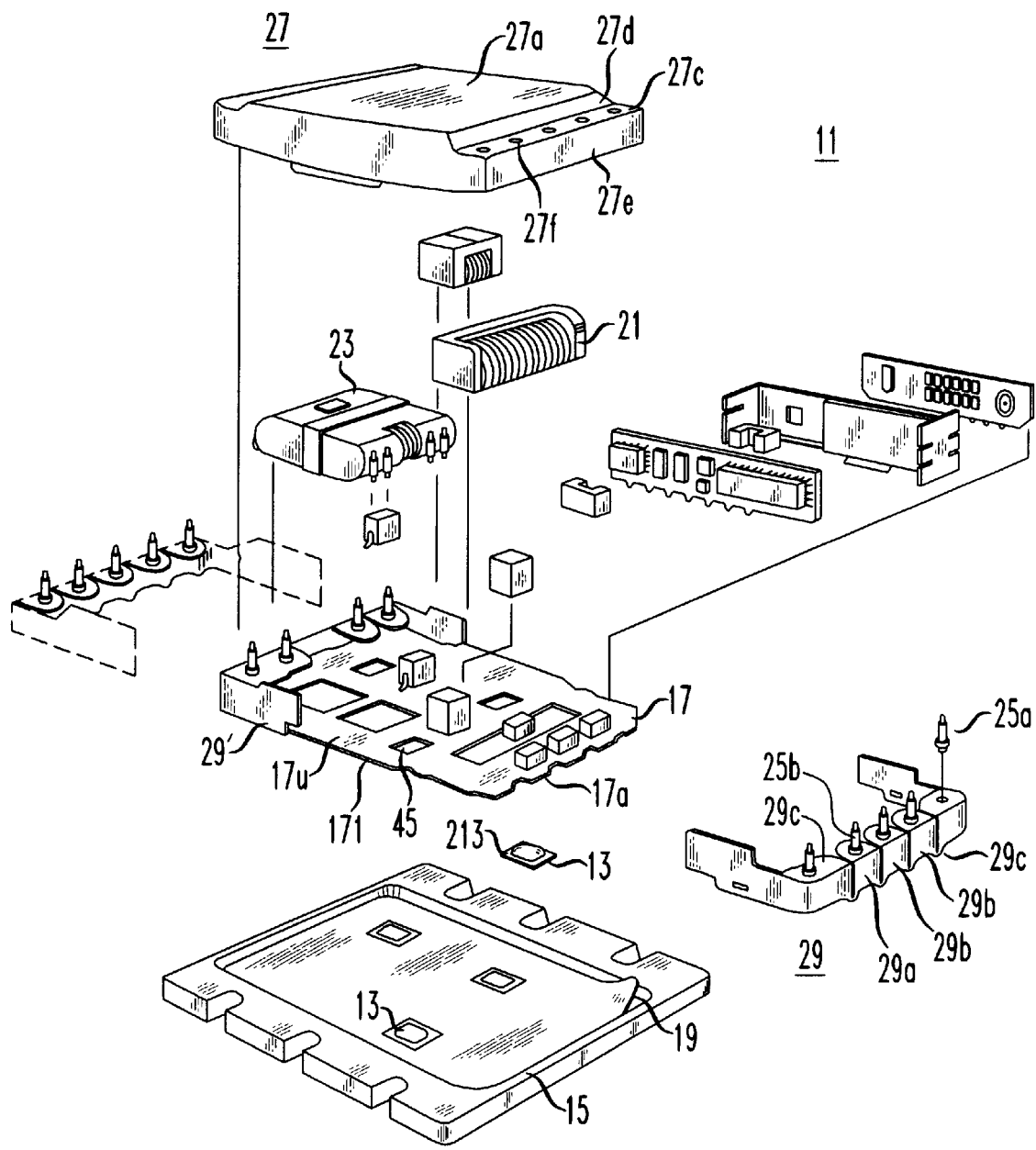
FIG. 6 illustrates an exploded isometric view of a prior art power supply.

To further understand the problems of conventional power supplies reference is made to FIG. 6, which illustrates an exploded isometric view of a prior art power supply 11. The power supply 11 includes a metal baseplate 15 containing an insulating material 19. Also included on baseplate 15 is a plurality of unpackaged power semiconductor devices (one of which is designated 13) attached to baseplate 15 using direct chip attach packaging technology. The power supply 11 further includes a plurality of circuit boards (one of which is designated 17) having a plurality of electrical components. Also included is a plurality of discrete magnetic components 23 and 21 in electrical communication with one or more of the printed circuit boards. A plastic case 27 serves to protect the components of power supply 11, and may also form a reservoir capable of containing an encapsulant.

For the reasons as previously mentioned, the power supply 11 endures several limitations. First, the design makes use of a plurality of printed circuit boards (three are shown), which may negatively affect the cost of power supply 11. Second, the design makes use of discrete power magnetic devices 21 and 23 and does not integrate planar magnetic devices into the board 17. This type of design does not allow components to be located directly above or below the magnetic device windings on the board 17, with the consequent reduction in achievable packaged power density. Third, the design requires several iterative manual steps that do not support a cost effective and mass producible design for power supplies. For example, the magnetic devices are produced separately, and are not produced as an integral part or the circuit board. Finally, the design requires the use of direct chip attach technology, including a means to connect the bare semiconductor die to printed circuit board 17 (perhaps using wire bonding), hence the design may be more costly to produce than is desirable.

Figure 7:
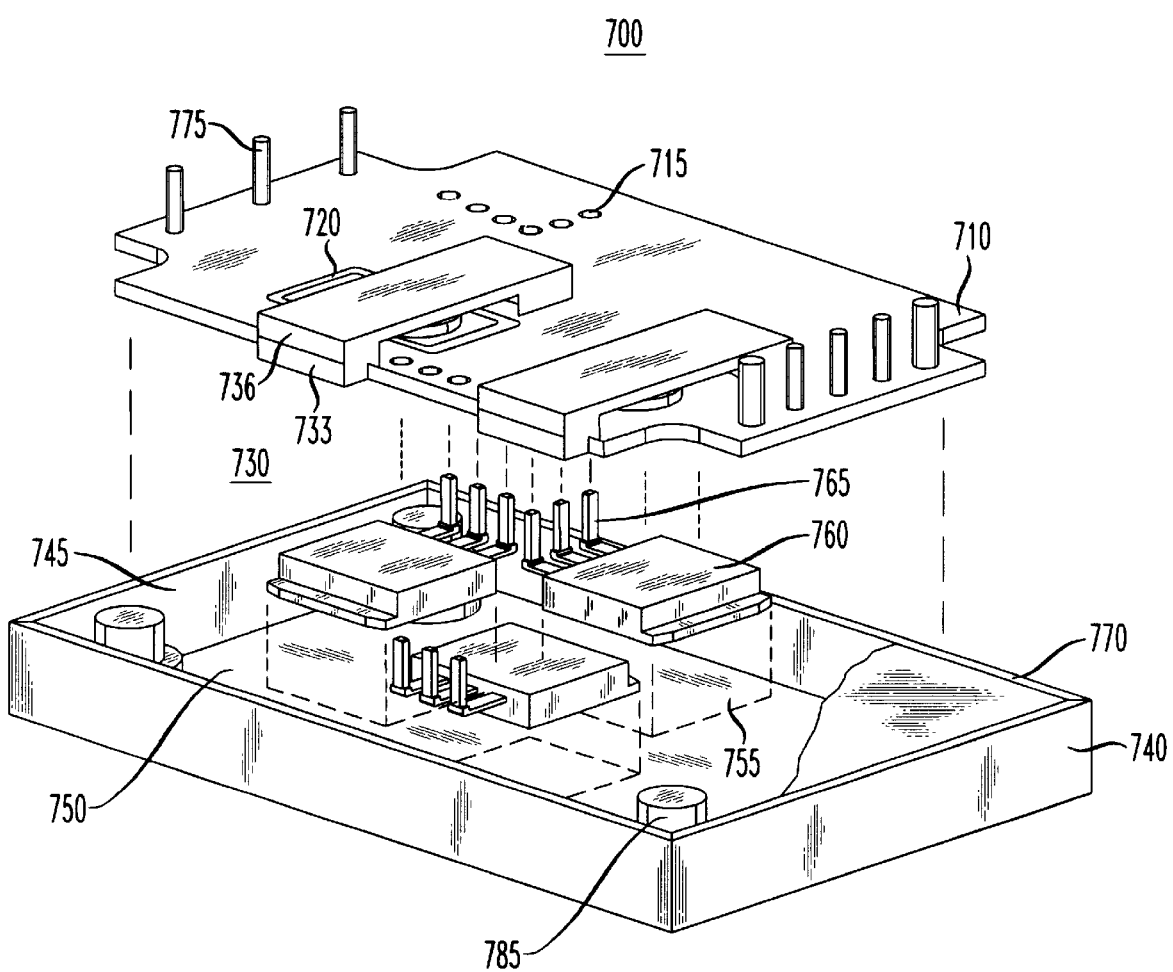
FIG. 7 illustrates an exploded isometric view of an embodiment of a power supply constructed according to the principles of the present invention.

Turning now to FIG. 7, illustrated is an exploded isometric view of an embodiment of a power supply 700 constructed according to the principles of the present invention. The power supply 700 includes a circuit board 710 containing conductors (generally designated 715) for interconnecting electrical components (that may be surface-mounted or through-hole mounted to the circuit board 710) of the power supply 700. Ones of the conductors 715 form windings 720 for a power magnetic device (an electrical component) 730 of the power supply 700. The power magnetic device 730 also includes a power magnetic device core (including a first core half 733 and a second core half 736) disposed through apertures of the circuit board 710 proximate the windings 720. The power supply 700 also includes a metal case 740. The metal case 740 may comprise a base and four side walls thus forming a five-sided reservoir to receive the circuit board 710 therein. The flat portion of the base 740 is located substantially parallel to circuit board 710, with a space in between 710 and 740 to accommodate electrical and/or mechanical components. Alternatively, the metal case 740 may be formed without one or more of the side walls to allow air to flow in the space between the case 740 and the circuit board 710, advantageously assisting in the removal of heat from internal components. The metal case 740 may also have an integral electrically insulating middle layer 745 and an integral electrically conductive inner circuit layer 750. Portions of the inner circuit layer 750 are capable of being removed to form electrically conductive traces therein (one of which is designated 755). Case 740 may still further include a means for attaching an external heatsink shown in the illustrated embodiment as internally threaded posts protruding from case 740, one of which is designated 785. In the illustrated embodiment, the metal case 740 is made of an insulated metal substrate such as a THERMAL CLAD substrate. Of course, other substrates or casing materials are well within the broad scope of the present invention.

The power supply 700 also includes a plurality of power semiconductor devices (e.g., a switching device, one of which is designated 760) having a body connected in thermal communication with the metal case 740 and terminals 765 coupleable to the conductors 715 of the circuit board 710. In the illustrated embodiment, the power semiconductor devices 760 may be soldered to the metal case 740 using a printed circuit trace 755. The solder joint between the power semiconductor devices 760 and the metal case 740 facilitates a good thermal coupling there between. The soldering process also enhances an automatic assembly (e.g., for repeatability purposes) of the power supply 700. Of course, other connection techniques and methods are well within the broad scope of the present invention. Alternatively, terminals of device 760 may be electrically connected directly to the base of 740. Separate interconnection pins may be used to electrically connect terminals of device 760 to conductors 715 of circuit board 710 (embodiment not shown). The power supply 700 may further include an encapsulant 770, located within the reservoir, for providing a path for heat generated by the electrical components of the power supply 700, and a mechanical fixture to resist displacement of the electrical components. While the encapsulant 770 is illustrated in only a portion of the reservoir, it may substantially fill the reservoir. The power supply 700 still further includes electrical leads (e.g., posts, one of which is designated 775) extending from the power supply 700 that allow the power supply 700 to be coupled to a printed wiring board of an electrical piece of equipment (not shown) employing the power supply 700 to advantage. For instance, the electrical leads 775 may be formed into a gull-wing configuration for surface mounting the power supply 700 to the printed wiring board of the electrical piece of equipment. In an alternative embodiment, ones of the traces 755 may be etched into a periphery of an inner circuit layer of case 740 to serve as the electrical leads 775 for the power supply 700. For a better understanding of a technique for employing traces of a substrate as leads see *A New Leadframeless IC Carrier Package using Metal Base Substrate,* by Junsuke Tanaka, Kunihiro Nagmin, Tshiharu Koike and Seuchi Takahashi, ISHM Proceedings (1995), incorporated herein by reference.

Figure 8A:
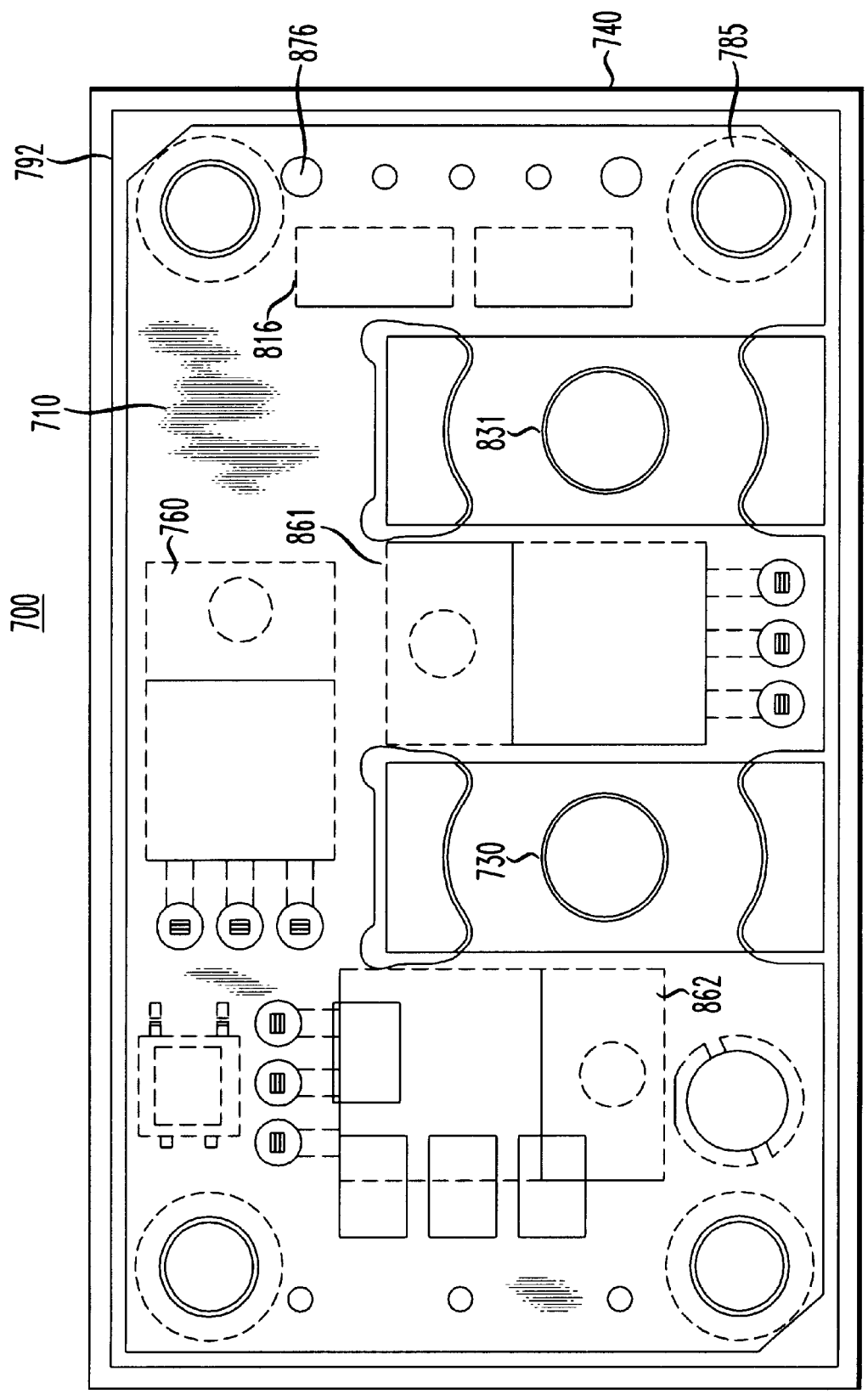
FIG. 8A illustrates a see through bottom view of an embodiment of a power supply constructed according to the principles of the present invention.

Referring now to FIG. 8A, illustrated is a see through bottom view of an embodiment of power supply 700 constructed according to the principles of the present invention. Devices illustrated using dashed lines are located on the far side of circuit board 710, or are mounted to case 740. Note that power switching device 760 is advantageously located between magnetic device 730 and a side wall 792 of case 740, with only enough space there between to accommodate normal mechanical and manufacturing design margin. Switching device 760 is illustrated as packaged in a TO-220 size package, a standard power package size in the electronics industry. Of course, other package sizes ($D^2PAK$, SOT-223, etc.) are within the broad scope of the invention. Also, magnetic core devices 730 and 831 are illustrated as modified ETD-19 sized cores, wherein the ETD-19 is a standard core size manufactured by the TDK Corporation of Tokyo, Japan. (The ETD-19 cores used in the illustrated embodiment are reduced in height from standard ETD-19 core size, but otherwise retain the ETD-19 shape.) Therefore, a width dimension A of case 740, shown as 1.450 inches, is advantageously established as a practical dimension necessary to accommodate industry standard package sizes, namely the TO-220 and the ETD-19. Making the case dimension A larger would have the undesirable effect of increasing module footprint area. Making the case dimension A smaller may require the use of nonstandard parts (e.g., a custom core size, and/or a direct chip attach technology), thereby undesirably increasing the cost of the module.

Figure 8B:
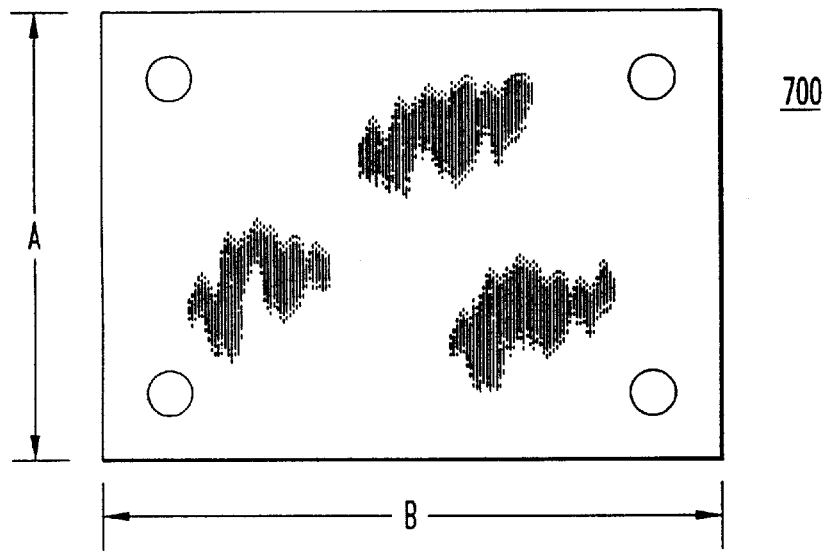
FIG. 8B illustrates a top view of an embodiment of a power supply constructed according to the principles of the present invention.
Figure 8C:
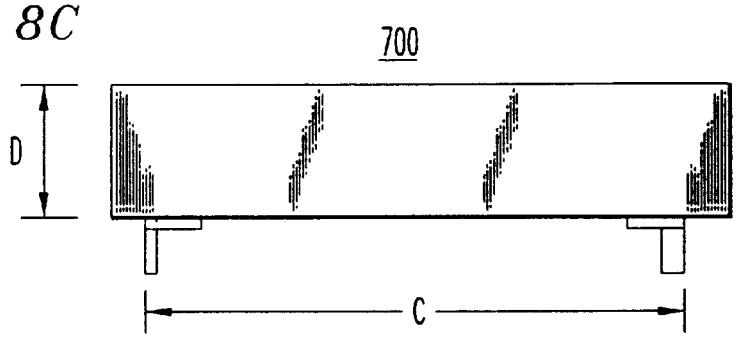
FIG. 8C illustrates a side view of an embodiment of a power supply constructed according to the principles of the present invention.
Figure 8D:
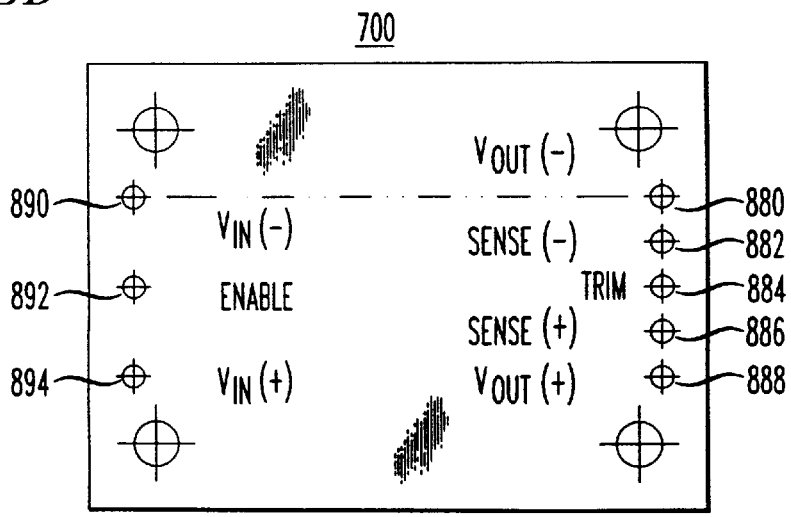
FIG. 8D illustrates a bottom view of an embodiment of a power supply constructed according to the principles of the present invention.

Additionally, power switching device 861 (also illustrated as a TO-220) is conveniently located between magnetic devices 730 and 831, also with only enough space there between to accommodate normal mechanical and manufacturing design margin. A power switching device 862 is located on the opposite side of magnetic device 730 (with respect to 861). Filter components, one of which is designated 816, are located between magnetic device 831 and a row of electrical leads, one of which is designated 876. Therefore, a dimension B of case 740, shown as 2.300 inches, is advantageously established as a practical dimension necessary to accommodate industry standard package sizes (the TO-220 and the ETD-19), the electrical leads, and the heatsink attachment mechanism 785. Making the case dimension B larger would have the undesirable effect of increasing module footprint area. Making the case dimension B smaller may require the use of nonstandard parts (e.g., a custom core size, and/or a direct chip attach technology), thereby undesirably increasing the cost of the module. Additionally, designing the power module using devices substantially smaller than a TO-220 or an ETD-19 may detrimentally reduce the available output power, or increase internal power dissipation, or both. Also, a dimension C of case 740, shown as 2.000 inches, is advantageously established as a practical dimension necessary to accommodate the separation of input and output leads using industry standard package sizes. Making the case dimension C larger would have the undesirable effect of increasing module footprint area, or reducing the required spacing between the leads and the case 740. Making the case dimension C smaller may reduce the usable board area of printed circuit board 710, thereby undesirably reducing output power, or increasing the cost of the module, or both. Thus, it is an objective of the present invention to provide a power supply module package which uses to advantage the space inside the module with a minimum of unused space, while also maintaining a high packaged power density at high efficiency. FIGS. 8B, 8C, and 8D are top, side, and bottom views, respectively, of a power module 700 constructed according to the principles of the present invention. FIGS. 8C, and 8D illustrate the spacing between the electrical leads of the illustrated embodiment dimension C. Also illustrated are preferred height and external dimensions of a module constructed according to the principles of the present invention. Referring specifically to FIG. 8C is shown the preferred height D, which in the exemplary embodiment is 0.50 inches. Referring specifically to FIG. 8D are pinout (also referred to as leads) designations $V_{OUT}(-)$ 880, Sense (-) 882, Trim 884, Sense(+) 886, $V_{OUT}(-)$ 888, $V_{IN}(-)$ 890, ENABLE 892, $V_{IN}(+)$ 894. In the preferred embodiment, the space between each successive lead 880–88 is 0.150 inches for a total of 0.600 inches between the Output leads 880 and 888. The space between each successive lead 890–94 is 0.300 for a total of 0.600 inches between leads 890 and 894. The operation of leads 880–894 will be described in more detail below.

Figure 9:
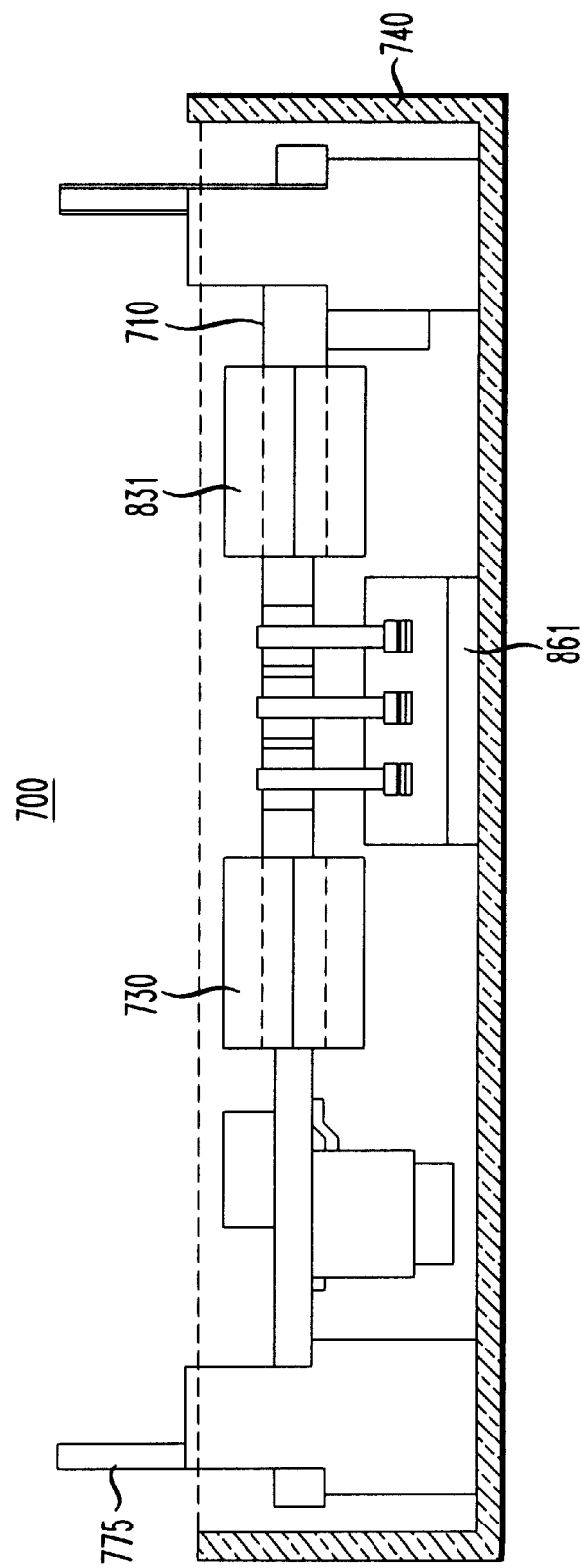
FIG. 9 illustrates a side cut away view of an embodiment of a power supply constructed according to the principles of the present invention.

FIG. 9 illustrates a side cut away view of an embodiment of power supply 700 constructed according to the principles of the present invention. Note that the space (approximately 0.075 inches) between power switching device 861 and printed circuit board 710 is large enough to accommodate small surface mount components (not shown), thereby making use of board space normally considered unusable for component placement. In the illustrated embodiment, power module dimension, height D shown as 0.500 inches, is tall enough to accommodate case 740, switching device 861, and cores 730 and 831, while maintaining the desirable attribute of a low overall low profile. Of course, other power module height profiles would be within the broad scope of the invention, including, but not limited to, 0.300 inches to 0.600 inches. For example, it may be possible to reduce the height of the cores (at perhaps a lower power level, or higher switching frequency), and/or reduce the thickness of board 710, and/or reduce the space between board 710 and switching device 861, in order to reduce the overall height of the module. Conversely, it may be desirable to increase the board or core thickness, etc., resulting in an increase in module height. Alternate embodiments which may advantageously change the power module height are within the spirit and broad scope of the invention, however.

Still referring to FIG. 9, power magnetic devices 730 and 831 comprise planar magnetic devices which are integrated into circuit board 710, wherein conductors of circuit board 710 (not shown) form the windings of the planar magnetic devices, and the cores of the planar magnetic devices are disposed through apertures of the circuit board proximate the windings. Shown in the illustrated embodiment are two magnetic devices which may form, for example, a power transformer and a power inductor. Of course, it is well known to those skilled in the art to combine a transformer and inductor into a single integrated magnetic device requiring, for example, a single core structure. For a better understanding of integrated magnetic design techniques, see Modern DC-to-DC *Switchmode Power Converter Circuits*, by Rudolph P. Severns and Gordon Bloom, © 1985, Van Nostrand Reinhold Company, New York, N.Y., and *Low Loss Synchronous Rectifier for Application to Clamped-Mode Power Converters*, U.S. Pat. No. 5,625,541, issued to Allen F. Rozman. The two aforementioned references are herein incorporated in their entirety by reference.

While the aforementioned power module package with dimensions A, B, C, and D, use to advantage standard power switching and magnetic component sizes, a complete power module contains control and filtering circuitry which must also be packaged within the module dimensions. It is desirable to package the control and filtering components on a single printed circuit board, thereby reducing the cost and manufacturing complexity normally associated with a multiple board design.

Figure 10:
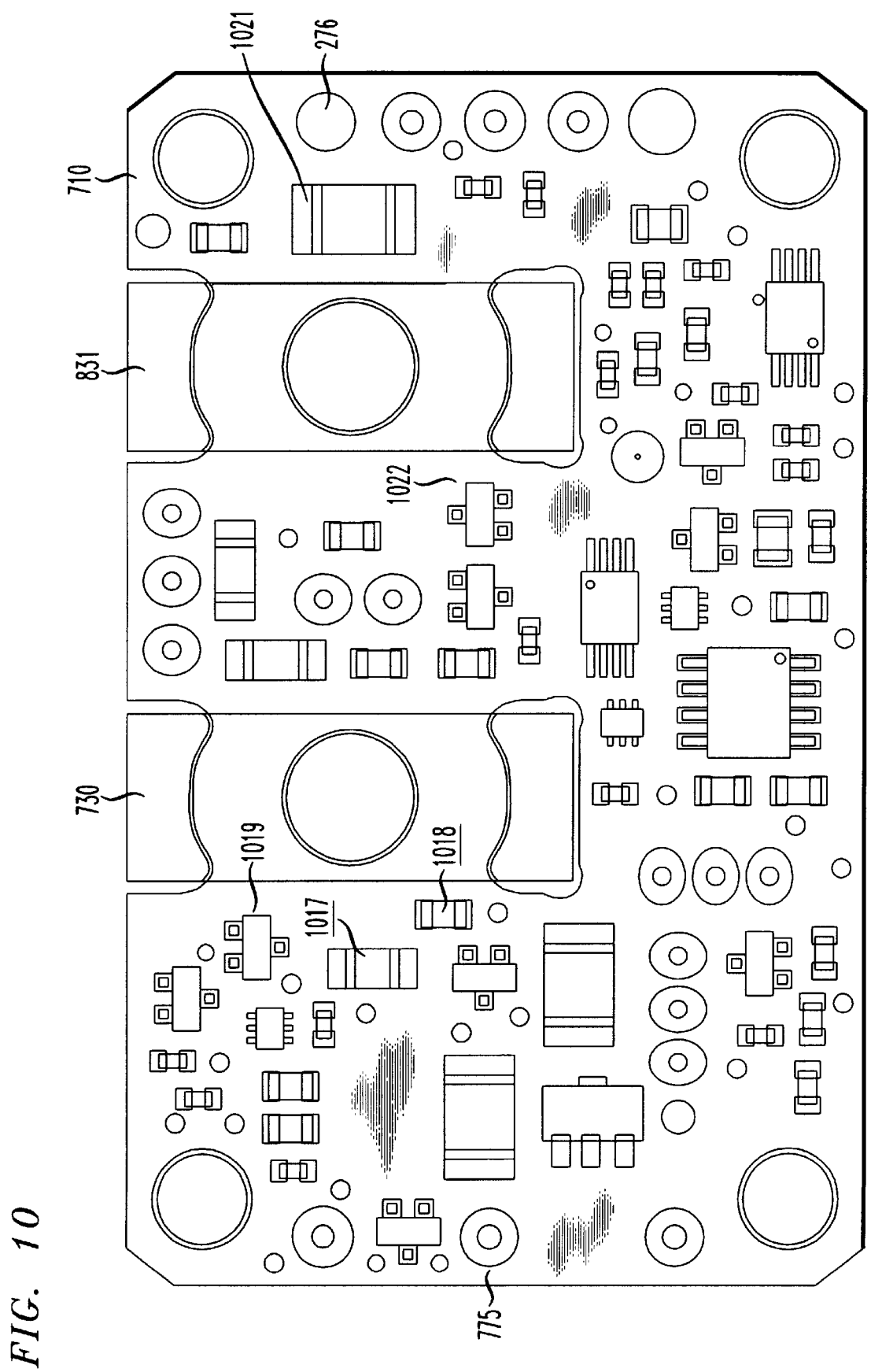
FIG. 10 illustrates a detailed view of a possible component placement for a circuit board of a power supply constructed according to the principles of the present invention.

One possible arrangement of components on board 710 is illustrated in FIG. 10. Note that the aforementioned components occupy virtually all of the available board space on board 710. However, many of the components on board 710, some of which are designated 1017, 1018, 1019, 1021, and 1022, are located directly above the windings of planar magnetic devices 730 and 831, thereby partially exposing the components to the magnetic and electric fields generated by the windings. Locating control and filtering components in such close proximity to magnetic windings (less than 0.200 inches) is normally considered undesirable, as the fields generated by the windings can induce voltages and/or currents which can upset the operation of sensitive circuitry. Therefore, the space directly above or below magnetic windings is normally considered unsuitable for control or filtering components.

Figure 11:
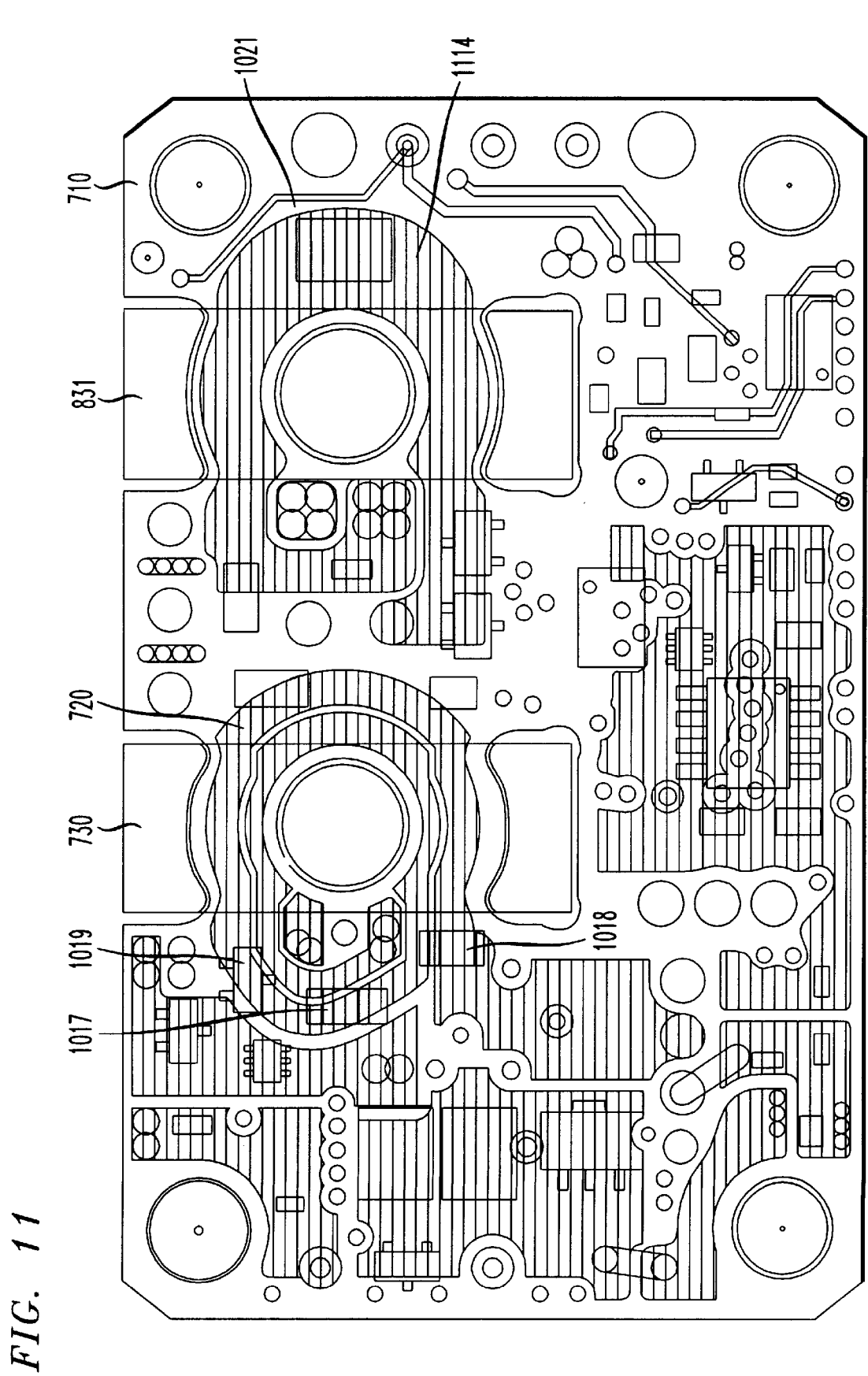
FIG. 11 illustrates a detailed view of possible printed circuit board traces of a power supply constructed according to the principles of the present invention.

In the illustrated embodiment, board 710 is a multi-layer board. Shown in FIG. 11 is a possible arrangement of circuit traces on a layer of board 710, including magnetic device windings 720 and 1114. Superimposed onto the circuit traces of FIG. 11 are the components of FIG. 10. Note that the superposition of components onto the circuit traces is for illustrative purposes only. The circuit traces of FIG. 11 are located, for example, on an inner circuit layer, and as such are not in direct contact with the components of FIG. 10. However, windings 720 and 1114 may still adversely affect components in close proximity to the windings.

Therefore, in order to advantageously package all planar magnetic, control and filtering components onto a single board, it may be necessary to use the board space directly above the windings. However, components located directly above or below the windings must be chosen with great care to insure that such location does not upset the operation of the overall circuit. For example, it may be considered undesirable to locate high speed digital circuitry, or possibly a pulse width modulation (PWM) control IC, directly above the windings, as such a location may seriously impair the functionality of the power module. In general, low impedance circuits, circuits which process DC power (such as a bias circuit linear regulator), circuits which are not functioning during normal operation (such as a startup regulator), or circuits which are otherwise not undesirably affected by the electric and magnetic fields generated by the magnetic windings, would be considered potential candidates for placement above the windings.

Figure 12:
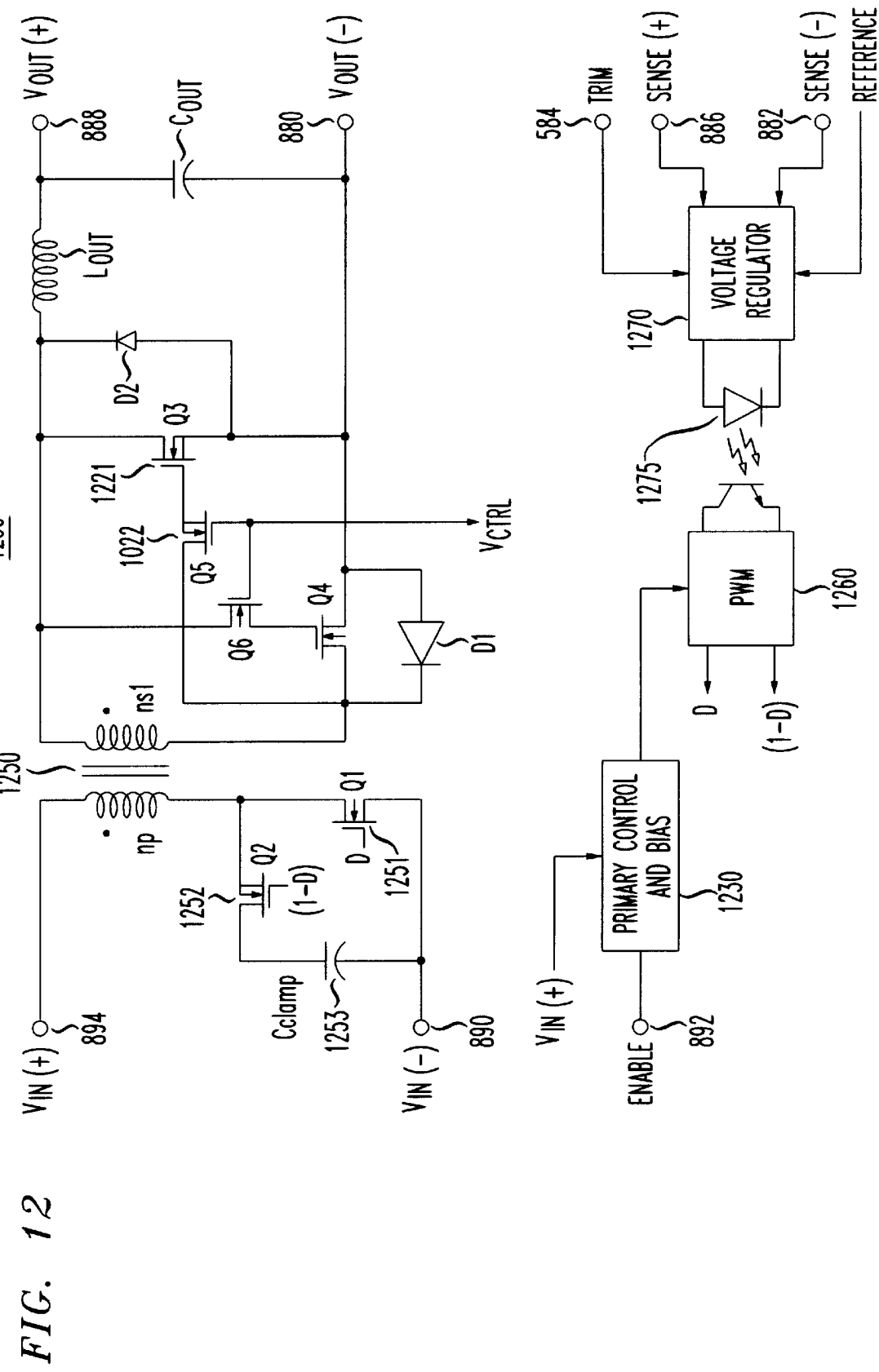
FIG. 12 illustrates a block diagram and simplified circuit schematic of a power converter constructed according to the principles of the present invention.

In FIG. 12 is illustrated a block diagram and simplified schematic of a power converter circuit 1200 constructed according to the principles of the present invention. The embodiment shown in FIG. 12 is an isolated DC/DC converter including a transformer 1250, a power switch 1251 and clamp circuit 1252 and 1253, with self driven synchronous rectifiers (one of which is designated 1221). The detailed operation of power converter circuit 1200 is described in; *Low Loss Synchronous Rectifier for Application to Clamped-Mode Power Converters,* U.S. Pat. No. 5,303,138, issued to Allen F. Rozman, or *Self-Synchronized Drive Circuit for a Synchronous Rectifier in a Clamped-Mode Power Converter,* U.S. Pat. No. 5,590,032, issued to W. C. Bowman, et al.. The two aforementioned patents are commonly assigned and incorporated herein by reference. Also included in power supply 1200 is a voltage regulator 1270, a pulse width modulator (PWM) 1260, an isolation optocoupler 1275, and a primary control and bias circuit 1230. The exact design of the control portions of the circuit (1230, 1260, and 1270) necessary to achieve the desired regulation is well known in the art and hence is not disclosed in detail herein.

In the illustrated embodiment of FIGS. 10, 11, and 12, components 1017, 1018, and 1019 comprise primary bias circuit components (a rectifier, capacitor, and linear regulator) corresponding to block 1230. Additionally, component 1022 corresponds to MOSFET 1220, a gate voltage limiting device. In this example, the components chosen to be located above the magnetic windings are substantially insensitive to the fields generated by windings 720 and 1114. The components chosen are by way of example, and represent only a subset of possible components which could be chosen for location above the windings. One skilled in the art could determine other circuit components suitable for such location, and also determine components which would be undesirable to locate directly above the windings.

Also illustrated in FIG. 12 are the portions of circuit 1200 which communicate to an external circuit card via the input and output leads. Shown are the leads $V_{IN}(+)$ 894 and $V_{IN}(-)$ 890, which serve to connect the power module to a source of DC input power. Possible sources of input power, including batteries or a power factor correction and rectifier circuit, are well known in the art and hence are not disclosed in detail herein. It is also well known in the art that either lead 894 or 890 could be connected to input ground, depending on the specific system configuration.

Also shown in FIG. 12 is lead 892, designated the Enable lead. This lead is illustrated as connected to the primary control and bias circuit, and allows the user to configure the module on or off, and perhaps reset an internal protection latch. The Enable lead 892 can be used in a variety of ways, as is known in the art. For example, in some designs it may be desirable to turn the module on with the ENABLE lead 892 substantially shorted to $V_{IN}(-)$ 890, and turn the module off with the ENABLE lead substantially open. In another design, it may be desirable to turn the module on with the ENABLE lead 892 substantially shorted to VIN(+) 894, and turn the module off with the Enable lead substantially open. In still other designs it may be desirable to turn the module on with the Enable lead 892 substantially open, and off with the Enable lead 892 substantially shorted to either $V_{IN}(+)$ 894 or $V_{IN}(-)$ 890. The exact design of the circuitry required to interface the ENABLE lead 892 to the power supply control is well known in the art and hence is not disclosed in detail herein.

On the output side of power supply 1200 is shown the power output pins $V_{OUT}(+)$ 888 and $V_{OUT}(-)$ 880. These leads are operable for connecting the power module output to a load being powered. Output leads TRIM 884, SENSE(+) 886, and SENSE(-) 882, which communicate with voltage regulator 1270, are disclosed in more detail in the circuit of FIG. 13.

Figure 13:
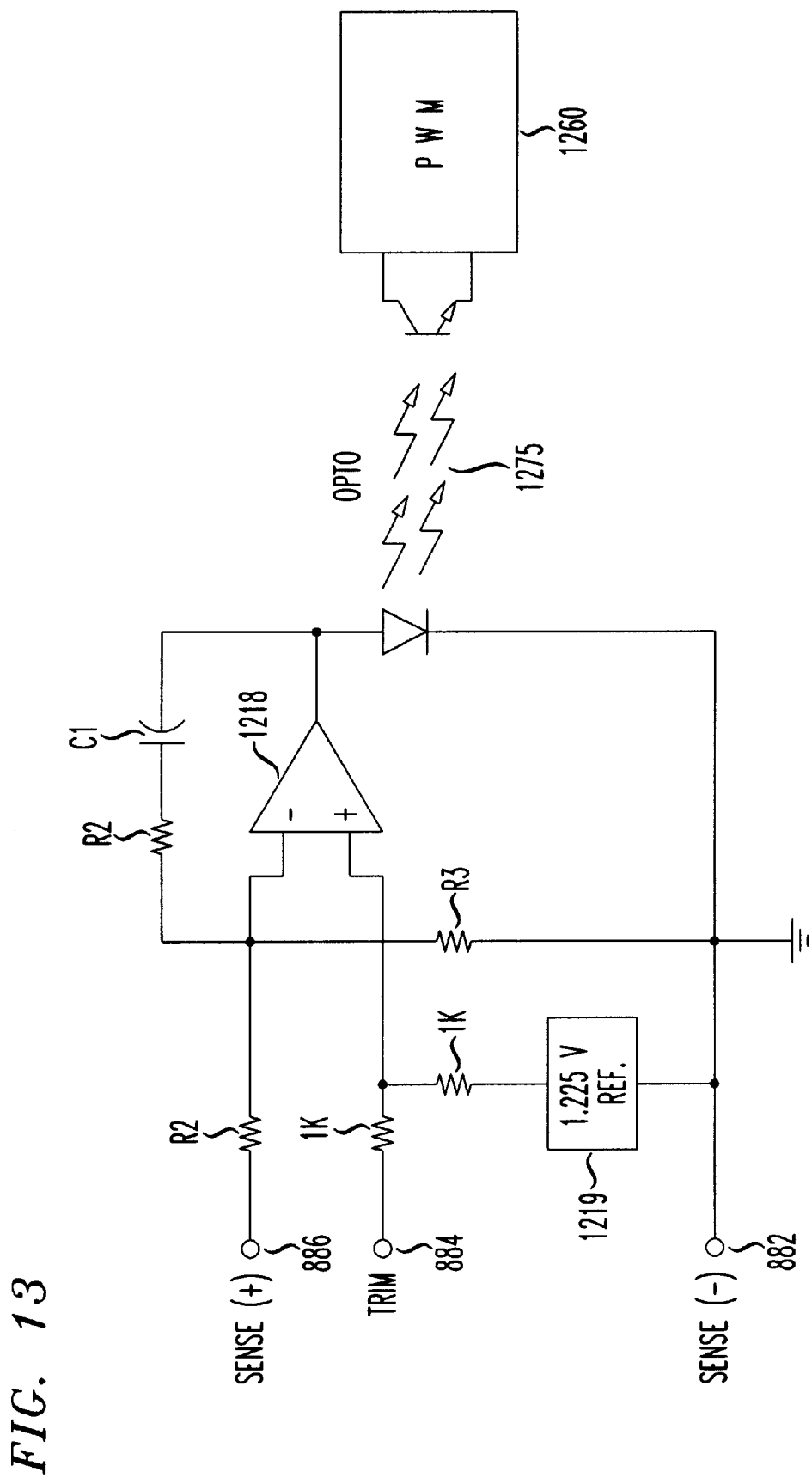
FIG. 13 illustrates a simplified circuit schematic of the Sense(+), Sense(−), and Trim functions of a power converter constructed according to the principles of the present invention.

Accordingly, referring to FIG. 13, remote sense leads 886 and 882 are often required to allow the power module to maintain tight regulation while compensating for unavoidable voltage drops due to, for example, an ORing diode, or interconnection resistance between the module and the circuit being powered. This is of particular importance in low voltage, high current power modules, where such voltage drops can exceed the regulation requirements of the circuitry being powered. Because the present invention is directed to a power module useful in a flexible distributed power architecture, remote sense pins are considered essential. It is a critical aspect of the present invention therefore to allow space internal to the module to accommodate the remote sensing function. While techniques for realizing a remote sensing function external to the power module are known in the art, such an external implementation substantially diminishes the benefits of using a high density module, as precious space is required on the circuit card for the external remote sense circuitry.

The Trim lead 884 is used to remotely program the voltage setpoint of the power module. In the illustrated embodiment, the Trim lead 884 may adjust the level of the internal regulation reference. This may be accomplished, for example, by connecting an external voltage source to pin 884, or by connecting a resistor (a fixed value or a potentiometer) between pin 884 and either sense pins 882 or 886. Any of the above mentioned techniques will serve to adjust the regulation reference, and hence the output voltage setpoint. Of course, the trim lead 884 could be internally connected in a different manner (at the junction of R2 and R3, for example) and still be within the broad scope of the present invention. One skilled in the art could devise many implementations of the internal circuitry of Trim lead 884, or devise alternative external connections of lead 884 for the purpose of programming the setpoint of the power module, and such alternate embodiments would lie within the broad scope of the present invention.

Figure 14:
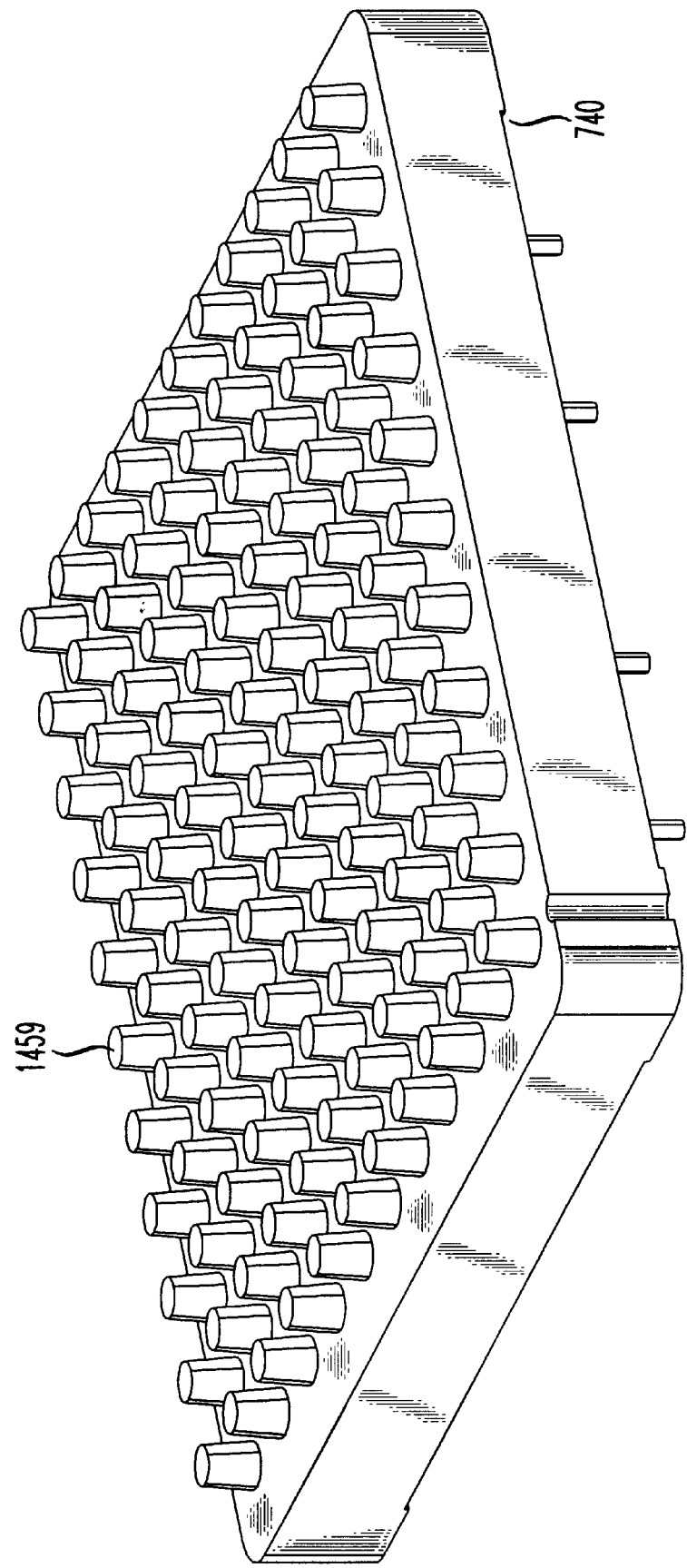
FIG. 14 illustrates an integral case and heatsink embodiment of a power supply constructed according to the principles of the present invention.

In FIG. 14 is shown an embodiment wherein case 740 has a pin-fin heatsink constructed as an integral part of the case. Included are a plurality of heatsink pins (one of which is designated 1459) operable to assist in transferring heat dissipated inside the module to the outside environment. In a conventional design, a separate heatsink is attached to the module, perhaps using screws or clips. In such a conventional configuration, there exists a substantial thermal impedance in the interface between the module case and the external heatsink, which detrimentally affects the thermal performance of the overall assembly. Often an interface material, such as a dry pad or thermal grease, is required between the module case and the heatsink to reduce the thermal impedance of the interface. Additionally, screws or clips are required to mechanically attach the heatsink to the module, usually requiring hand assembly. In the illustrated embodiment, a pin-fin heatsink arrangement is included as an integral part of the case, perhaps using a die casting manufacturing process. In the illustrated embodiment, the interface between the case and heatsink is eliminated, advantageously reducing the thermal impedance of the entire assembly. Additionally, no assembly is required, as the heatsink is part of the case. A pin-fin heatsink arrangement is shown, as this arrangement may advantageously accommodate airflow in more than one direction. In FIG. 14 a substantially square case is shown for illustrative purposes only. Any shape could be accommodated, including the substantially rectangular shape shown in FIG. 8A. Of course, one skilled in the art could devise other shapes or heatsink fin arrangements (such as long, straight fins, for example) or other manufacturing techniques (such as machining, or impact extruding, for example) without departing from the broad scope of the present invention.

While various detailed embodiments of the present invention have been described above, it should be understood that they have been presented by way of example, and not limitation. It should be understood by those skilled in the art that they can make various changes, substitutions and alterations herein without departing from the spirit and scope of the invention in its broadest form.

What is claimed is:

1. A power supply module having an input and an output, comprising:
    a circuit board containing conductors for interconnecting electrical components of said power supply module;
    a thermally conductive case having a substantially flat and rectangular base with an integral electrically insulating layer, said base forming first and second short sides and first and second long sides, said flat base located substantially in parallel with said circuit board, said thermally conductive case forming a reservoir receiving said circuit board therein;
    a power semiconductor device mounted in a space between said circuit board and said thermally conductive case and in electrical communication with said circuit board, wherein said power semiconductor device has a body connected in thermal communication with said thermally conductive case;
    a power magnetic device in electrical communication with said power semiconductor device, said power magnetic device operable for transferring electrical power between said input and said output of said power supply module;
    a set of at least three input electrical leads and a set of at least five output electrical leads extending from said power supply module, said input and output leads operable to couple said power supply module to a printed circuit card;
    wherein said input leads are arranged in a row substantially parallel to said first short side of said base, said input leads comprising at least the functions $V_{IN}(+)$, $V_{IN}(-)$, and ENABLE, and said output leads are arranged in a row substantially parallel to said second short side of said base, said output leads comprising at least the functions $V_{OUT}(-)$, $V_{OUT}(-)$, SENSE(+), SENSE(-), and TRIM.

2. The power supply module as recited in claim 1, wherein ones of said circuit board conductors are formed as windings and a core is disposed through apertures of said circuit board proximate said windings, said windings and said core forming said power magnetic device.

3. The power supply module as recited in claim 2, wherein ones of said electrical components are located on said printed circuit board proximate said windings.

4. The power supply module as recited in claim 1, wherein said thermally conductive case further comprises an integral electrically conductive circuit layer, portions of said circuit layer capable of being removed to form electrically conductive traces therein.

5. The power supply module as recited in claim 1, wherein an encapsulant substantially fills said reservoir.

6. The power supply module as recited in claim 1, wherein said input and output electrical leads comprise posts extending from said circuit board.

7. The power supply module as recited in claim 1, wherein said input and output electrical leads comprise surface mountable leads extending from said circuit board.

8. The power supply module as recited in claims 2 and 4, wherein said first and second short sides of said base are substantially 1.45 inches in width.

9. The power supply module as recited in claims 2 and 4, wherein said first and second short sides of said base are substantially 2.30 inches in length.

10. The power supply module as recited in claim 9, wherein the height of said module is substantially between 0.3 and 0.6 inches.

11. The power supply module as recited in claim 10, wherein said row of input leads is substantially in parallel to said row of output leads and separated from said row of output leads by about 2.0 inches.

12. A power supply module having an input and an output, comprising:
    a circuit board containing conductors for interconnecting electrical components of said power supply module, wherein ones of said circuit board conductors are formed as windings and a core is disposed through apertures of said circuit board proximate said windings, said windings and said core forming a power magnetic device, and said power magnetic device operable for transferring electrical power between said input and said output of said power supply module;
    a thermally conductive case having a substantially flat and rectangular base, said base forming first and second short sides and first and second long sides, said flat base located substantially in parallel with said circuit board;
    a power semiconductor device mounted in a space between said circuit board and said thermally conductive case and having a body connected in thermal communication with said thermally conductive case, said power semiconductor device connected in electrical communication with said circuit board and said power magnetic device; and a set of at least three input electrical leads and a set of at least five output electrical leads extending from said power supply module, said input and output leads operable to couple said power supply module to a printed circuit card;
    wherein said input leads are arranged in a row substantially parallel to said first short side of said base, said input leads comprising at least the functions Vin(+), Vin(-), and Enable, and said output leads are arranged in a row substantially parallel to said second short side of said base, said output leads comprising at least the functions Vout(+), Vout(-), Sense(+), Sense(-), and Trim.

13. The power supply module as recited in claim 12, wherein ones of said electrical components are located on said printed circuit board proximate said windings.

14. The power supply module as recited in claim 12, wherein said thermally conductive case further comprises an integral electrically insulating layer.

15. The power supply module as recited in claim 14, wherein said thermally conductive case further comprises an integral electrically conductive circuit layer, portions of said circuit layer capable of being removed to form electrically conductive traces therein.

16. The power supply module as recited in claim 12, wherein said input and output electrical leads comprise posts extending from said circuit board.

17. The power supply module as recited in claim 12, wherein said input and output electrical leads comprise surface mountable leads extending from said circuit board.

18. The power supply module as recited in claim 15, wherein said first and second short sides of said base are substantially 1.45 inches in width.

19. The power supply module as recited in claim 18, wherein said first and second long sides of said base are substantially 2.30 inches in length.

20. The power supply module as recited in claim 19, wherein the height of said module is substantially between 0.3 and 0.6 inches.

21. The power supply module as recited in claim 20, wherein said row of input leads is substantially in parallel to said row of output leads and separated from said row of output leads by about 2.0 inches.

22. A power supply module having an input and an output, comprising:

a circuit board containing conductors for interconnecting electrical components of said power supply module;

a thermally conductive case having a substantially flat and rectangular base, said base forming first and second short sides and first and second long sides, said flat base located substantially in parallel with said circuit board;

a power semiconductor device having a body connected in thermal communication with said thermally conductive case, said power semiconductor device mounted in a space between said circuit board and said thermally conductive case and in electrical communication with said circuit board;

a power magnetic device in electrical communication with said power semiconductor device, said power magnetic device operable for transferring electrical power between said input and said output of said power supply module; and a set of exactly three input electrical leads and a set of exactly five output electrical leads extending from said power supply module, said input and output leads operable to couple said power supply module to a printed circuit card;

wherein said input leads are arranged in a row substantially parallel to said first short side of said base, said input leads comprising the functions Vin(+), Vin(−), and Enable, and said output leads are arranged in a row substantially parallel to said second short side of side base, said output leads comprising the functions Vout (+), Vout(−), Sense(+), Sense(−), and Trim, and said row of output leads are separated from said row of input leads by about 2.0 inches.

23. The power supply module as recited in claim 22, wherein said circuit board conductors are formed as windings and a core is disposed through apertures of said circuit board proximate said windings, said windings and said core forming said power magnetic device.

24. The power supply module as recited in claim 23, wherein said electrical components are located on said printed circuit board proximate said windings.

25. The power supply module as recited in claim 22, wherein said thermally conductive case further comprises an integral electrically conductive circuit layer, portions of said circuit layer capable of being removed to form electrically conductive traces therein.

26. The power supply module as recited in claim 22, wherein said thermally conductive case forms a reservoir to receive said circuit board therein and an encapsulant substantially fills said reservoir.

27. The power supply module as recited in claim 22, wherein said input and output electrical leads comprise posts extending from said circuit board.

28. The power supply module as recited in claim 22, wherein said input and output electrical leads comprise surface mountable leads extending from said circuit.

* * * * *

UNITED STATES PATENT AND TRADEMARK OFFICE
CERTIFICATE OF CORRECTION

PATENT NO : 6,005,773
DATED : December 21, 1999
INVENTOR(S) : Allen Frank Rozman, David Leonard Stevens It is certified that error appears in the above-identified patent and that said Letters Patent is hereby corrected as shown below:

Claim 1, line 66 please replace " $V_{OUT(-)}, V_{OUT(-)},$ " with — $V_{OUT(+)}, V_{OUT(-)},$ —.

Signed and Sealed this

Twenty-second Day of August, 2000

Q. TODD DICKINSON

*Attest:*

*Attesting Officer*  *Director of Patents and Trademarks*